United States Patent
Tsorng et al.

(10) Patent No.: US 11,797,066 B2
(45) Date of Patent: Oct. 24, 2023

(54) SYSTEM CHASSIS WITH ROTATABLE PSU COVER

(71) Applicant: Quanta Computer Inc., Taoyuan (TW)

(72) Inventors: Yaw-Tzorng Tsorng, Taoyuan (TW); Jen-Jia Liou, Taoyuan (TW); Chun-Chen Hsu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 114 days.

(21) Appl. No.: 17/224,283

(22) Filed: Apr. 7, 2021

(65) Prior Publication Data

US 2022/0221915 A1 Jul. 14, 2022

Related U.S. Application Data

(60) Provisional application No. 63/137,556, filed on Jan. 14, 2021.

(51) Int. Cl.
| | |
|---|---|
| *G06F 1/18* | (2006.01) |
| *H05K 5/03* | (2006.01) |
| *H05K 5/02* | (2006.01) |

(52) U.S. Cl.
CPC .......... *G06F 1/188* (2013.01); *H05K 5/0221* (2013.01); *H05K 5/03* (2013.01)

(58) Field of Classification Search
CPC ....... G06F 1/188; G06F 1/184; H05K 5/0221; H05K 5/03; H05K 7/1432
See application file for complete search history.

(56) References Cited

U.S. PATENT DOCUMENTS

| | | | | | |
|---|---|---|---|---|---|
| 6,816,367 | B2 * | 11/2004 | Liu | .................. | G06F 1/184 |
| | | | | | 361/679.33 |
| 7,355,116 | B2 * | 4/2008 | Chen | .................. | H02G 3/0487 |
| | | | | | 174/559 |
| 8,743,563 | B2 * | 6/2014 | Liang | ................. | G06F 1/188 |
| | | | | | 361/802 |
| 9,210,828 | B2 * | 12/2015 | Liao | .................. | H05K 5/023 |
| 9,572,275 | B2 * | 2/2017 | Kao | .................. | H05K 7/1487 |
| 10,104,803 | B1 * | 10/2018 | Lin | .................. | H05K 7/16 |
| 10,168,747 | B2 * | 1/2019 | Zhu | .................. | H05K 7/1489 |
| 10,212,840 | B2 * | 2/2019 | Kuan | .................. | H05K 7/1487 |
| 10,317,949 | B1 * | 6/2019 | Lin | .................. | H05K 5/023 |
| 10,963,023 | B1 * | 3/2021 | Zheng | ................. | H05K 7/1409 |
| 11,058,024 | B2 * | 7/2021 | Yu | .................. | G11B 33/127 |
| 11,172,588 | B1 * | 11/2021 | Yang | .................. | H05K 5/0295 |
| 11,197,387 | B2 * | 12/2021 | Liu | .................. | G11B 33/128 |

(Continued)

*Primary Examiner* — Sagar Shrestha
(74) *Attorney, Agent, or Firm* — NIXON PEABODY LLP

(57) ABSTRACT

A power supply unit (PSU) housing configured to receive a PSU is disclosed. The PSU housing includes a top panel, a bottom panel opposite to the top panel, a first side panel, a second side panel opposite to the first side panel, and a PSU cover. The first side panel and the second side panel define a width of the PSU housing. The PSU cover extends along the width of the PSU housing. The PSU cover includes a first elongated plate and a second elongated plate, which are perpendicular to each other. The PSU cover is rotatable relative to the top panel, such that (i) in a first orientation, the first elongated plate of the PSU cover is above and parallel to the top panel, and (ii) in a second orientation, the second elongated plate of the PSU cover is about flush and parallel to the top panel.

11 Claims, 8 Drawing Sheets

(56) References Cited

U.S. PATENT DOCUMENTS

| | | | |
|---|---|---|---|
| 11,425,838 B2 * | 8/2022 | Antaran | H05K 7/1411 |
| 11,439,033 B2 * | 9/2022 | Mao | H05K 7/1457 |
| 2013/0279123 A1 * | 10/2013 | Lin | H05K 7/1487 |
| | | | 361/747 |
| 2013/0314865 A1 * | 11/2013 | Chuang | G06F 1/188 |
| | | | 361/679.02 |
| 2019/0093674 A1 * | 3/2019 | Kho | G06F 1/182 |
| 2021/0092861 A1 * | 3/2021 | Yu | H05K 7/1489 |
| 2023/0024568 A1 * | 1/2023 | Chen | H05K 7/1489 |

* cited by examiner

US 11,797,066 B2

SYSTEM CHASSIS WITH ROTATABLE PSU COVER

CROSS-REFERENCE TO RELATED APPLICATIONS

This application claims priority from and benefit of U.S. Provisional Patent Application Ser. No. 63/137,556, filed on Jan. 14, 2021, titled "Design Of PSU Foolproof Mechanism To Solve PCB Assembly," which is hereby incorporated by reference herein in its entirety.

FIELD OF THE INVENTION

The present invention relates generally to system chassis, and more specifically, to system chassis with a rotatable PSU cover.

BACKGROUND OF THE INVENTION

Power supply units (PSUs) can be used in computers (such as servers), and other electronic equipment that use DC voltage input power components. The PSU is used to convert AC power to regulated DC voltage. A computer system may include a printed circuit board assembly (PCBA) and a PSU connected to the PCBA. For example, FIG. 1 is a perspective view showing a prior art computer system 10 with a bottom panel 12. The prior art computer system 10 includes a PSU 30, which is installed in a PSU housing 20. The PSU 30 is also connected to the PCBA 40 positioned on the bottom panel 12. The PSU housing 20 includes a rear panel 22, which is better illustrated in FIG. 2.

FIG. 2 is a cross-sectional view taken along the line 2-2 showing the prior art computer system 10. The rear panel 22 of the PSU housing 20 includes a stopper 24, which prevents the PSU 30 from being inserted too far when the PSU 30 is inserted incorrectly (i.e., upside-down). As shown, a PCBA 50 cannot be lowered into the system 10, even though there is enough space on bottom panel 12, below the rear panel 22 of the PSU housing 20. Thus, as shown, the size of the PCBA that the system chassis 10 can accommodate is limited by the rear panel 22.

A need exists for more efficient utilization of chassis space, which would in turn allow faster computing performance as more components may be inserted in the chassis space. The present disclosure is directed to solving these problems.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a power supply unit (PSU) housing configured to receive a PSU from a first end of the PSU housing is disclosed. The PSU housing includes a top panel, a bottom panel opposite to the top panel, a first side panel, a second side panel opposite to the first side panel, and a PSU cover. The first side panel and the second side panel define a width of the PSU housing. The PSU cover extends along the width of the PSU housing. The PSU cover includes a first elongated plate and a second elongated plate, which are perpendicular to each other. The PSU cover is configured to rotate relative to the top panel, such that (i) in a first orientation, the first elongated plate of the PSU cover is above and parallel to the top panel, and (ii) in a second orientation, the second elongated plate of the PSU cover is about flush with and parallel to the top panel.

In some implementations, the PSU includes a body, a retractable latch, and a control board. A portion of the control board protrudes from the body of the PSU. In some implementations, when the PSU housing receives the PSU in a correct orientation (e.g., right-side up), the control board of the PSU extends through an opening at the second end of the PSU housing uncovered by the PSU cover, such that the retractable latch of the PSU is retracted. In some implementations, when the PSU housing receives the PSU in an incorrect orientation (e.g., upside-down), the first elongated plate of the PSU cover contacts the control board of the PSU, and the retractable latch of the PSU is exposed outside the PSU housing.

In some implementations, the PSU cover includes an aperture for receiving a screw to affix the PSU cover in the second orientation.

In some implementations, the PSU housing is positioned within a system chassis. The system chassis is configured to receive one or more electronic components outside of the PSU housing. In some implementations, the system chassis includes a base panel extending from the bottom panel of the PSU housing in a direction opposite to the first end of the PSU housing, such that at least a portion of the base panel is configured to support a printed circuit board (PCB).

In some implementations, the PSU cover is rotatably coupled to the first side panel and the second side panel of the PSU housing.

According to certain aspects of the present disclosure, a system includes a power supply unit (PSU) housing, a PSU cover, and a printed circuit board (PCB) outside the PSU housing. The PSU housing is configured to receive a PSU from a first end of the PSU housing. The PSU housing includes a top panel, a bottom panel opposite to the top panel, a first side panel, and a second side panel opposite to the first side panel. The first side panel and the second side panel define a width of the PSU housing. The PSU cover extends along the width of the PSU housing. The PSU cover includes a first elongated plate and a second elongated plate, which are perpendicular to each other. The PSU cover is coupled to the PSU housing at a second end of the PSU housing, such that (i) the first elongated plate of the PSU cover is positioned at a distance from the second end of the PSU housing, and (ii) the second elongated plate of the PSU cover is about flush with and parallel to the top panel of the PSU housing. The PCB is supported on a base panel extending from the bottom panel of the PSU housing.

In some implementations, when the PSU housing receives the PSU the correct orientation, the portion of the control board of the PSU extends into a connector of the PCB.

In some implementations, the PSU housing includes a divider positioned between the first side panel and the second side panel. The divider of the PSU housing is configured to separate a first PSU from a second PSU.

In some implementations, the system further includes a system housing such that the PSU housing is positioned within the system housing. The system housing is configured to receive one or more electronic components outside of the PSU housing.

According to certain aspects of the present disclosure, a method for assembling a system having a system chassis is disclosed. The system chassis includes a power supply unit (PSU) housing configured to receive a PSU from a first end of the PSU housing. The PSU housing includes a top panel, a bottom panel opposite to the top panel, a first side panel, and a second side panel opposite to the first side panel. The first side panel and the second side panel define a width of the PSU housing. The system chassis also includes a PSU cover extending along the width of the PSU housing. The PSU cover including a first elongated plate and a second elongated plate, which are perpendicular to each other. The PSU cover is coupled to the PSU housing at a second end of the PSU housing, such that (i) in a first orientation, the first elongated plate of the PSU cover is above and parallel to the top panel of the PSU housing, and (ii) in a second orientation, the second elongated plate of the PSU cover is about flush with and parallel to the top panel of the PSU housing. The system chassis also includes a base panel extending from the bottom panel of the PSU housing, in a direction opposite to the first end of the PSU housing. At least a portion of the base panel is configured to support a printed circuit board (PCB). The PSU cover is placed in the second orientation. The PSU is inserted from the first end of the PSU housing towards the second end of the PSU housing. Whether a retractable latch of the PSU is exposed outside the PSU housing is determined.

In some implementations, prior to placing the PSU cover in the second orientation, the PCB is lowered onto the base panel of the system chassis.

In some implementations, in response to determining that the retractable latch of the PSU is exposed outside the PSU housing, the PSU is removed from the PSU housing. The PSU is rotated about 180 degrees around a longitudinal axis of the PSU. The PSU is re-inserted from the first end of the PSU housing towards the second end of the PSU housing.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
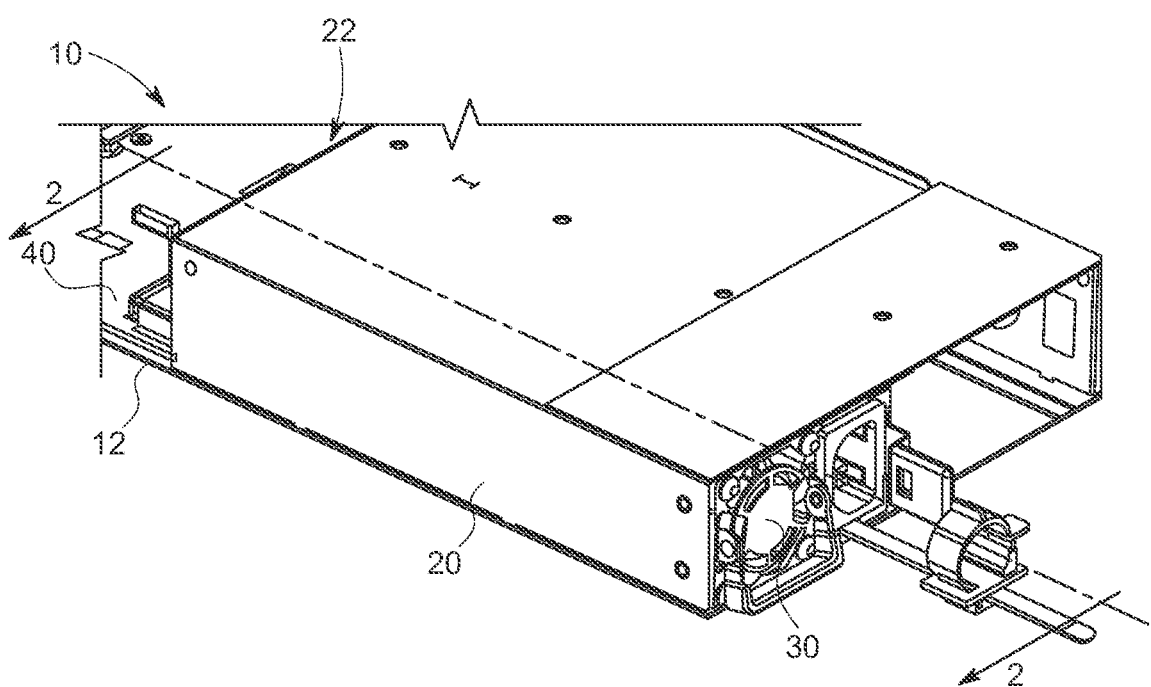
FIG. 1 is a perspective view showing a prior art computer system having a power supply unit (PSU) housing.
Figure 2:
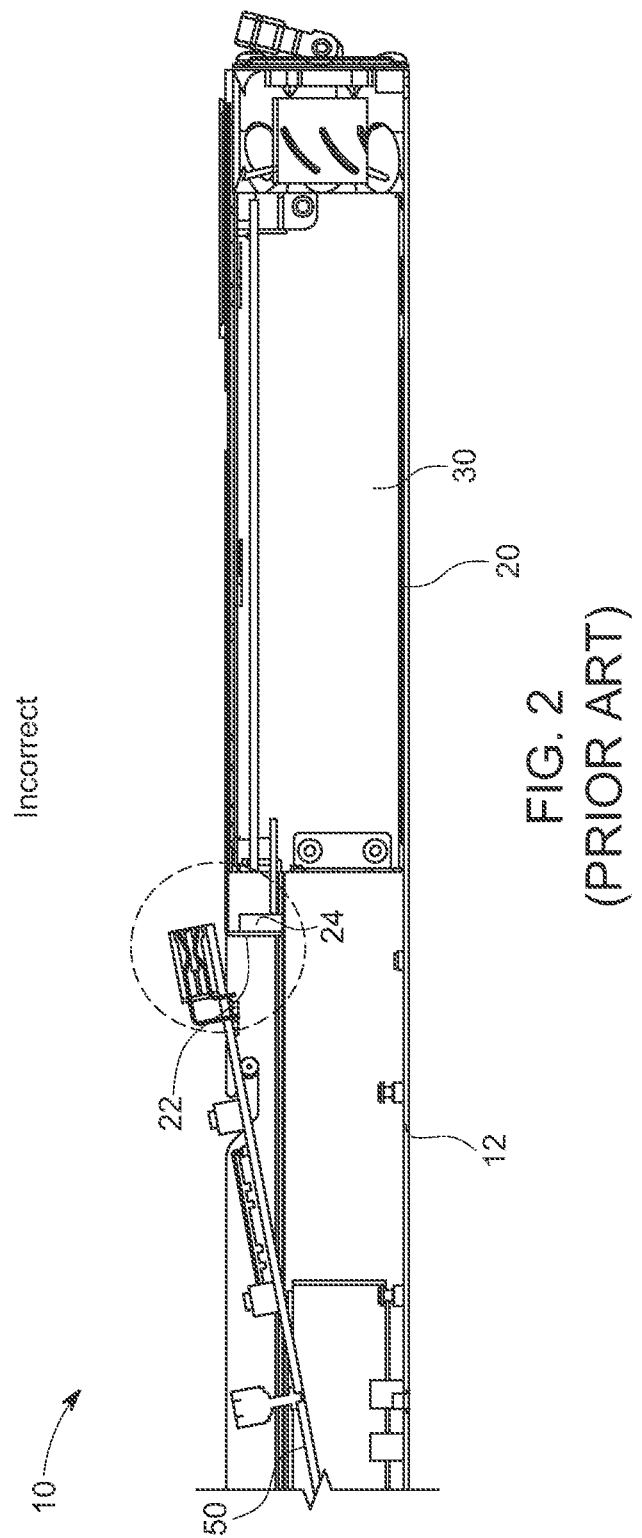
FIG. 2 is a cross-sectional view showing the prior art computer system of FIG. 1.

The present disclosure relates to a system chassis having a power supply unit (PSU) housing that includes a rotatable PSU cover. For example, when implemented as a part of a server chassis, the system chassis of the present disclosure can accommodate a larger printed circuit board (PCB) and/or more cable routing space, compared to a traditional PSU housing of similar size, because the rotatable PSU cover provides additional horizontal clearance for the PCB to be lowered into the system chassis.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 3:
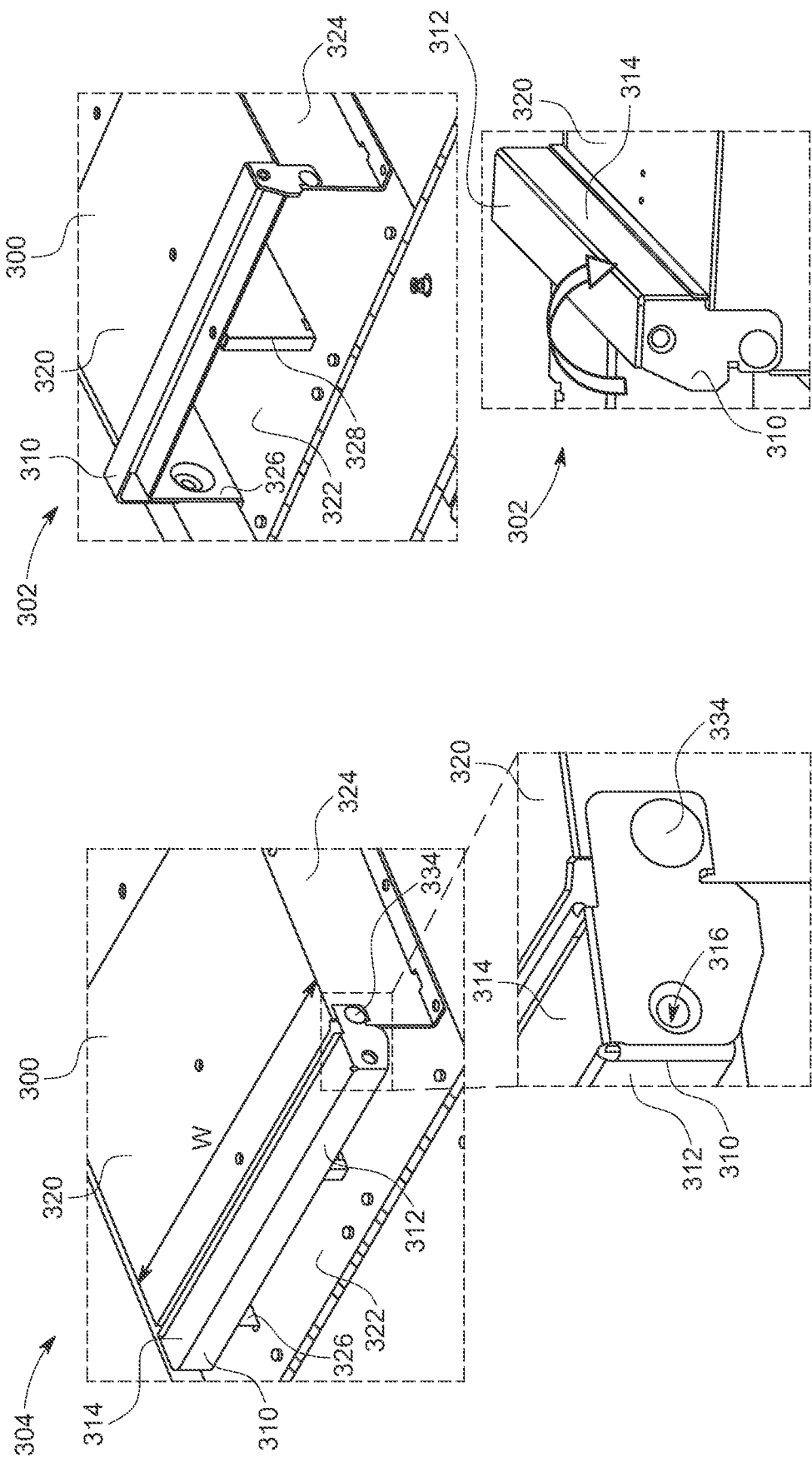
FIG. 3 is a perspective view showing a PSU cover of a system chassis in a first orientation and in a second orientation, according to certain aspects of the present disclosure.

Referring to FIG. 3, a perspective view of a PSU housing 300 of a system chassis is shown, according to certain aspects of the present disclosure. The system chassis may be a chassis for a computer system such as a server, or another electronic component that requires a PSU. The PSU housing 300 includes a top panel 320, a bottom panel 322 (opposite to the top panel 320), a first side panel 324, and a second side panel 326 (opposite to the first side panel 324). The first side panel 324 and the second side panel 326 define a width W of the PSU housing 300. One or more PSUs (not shown) are inserted between the side panels 324 and 326. In this example, the PSU housing 300 can accommodate two PSUs. Thus, in some implementations, the PSU housing 300 includes a divider 328 positioned between the first side panel 324 and the second side panel 326 for separating the two PSUs.

A PSU cover 310 extends along the width W of the PSU housing 300. The PSU cover 310 is coupled to the first side panel 324 and the second side panel 326 of the PSU housing 300, such that the PSU cover 310 is swingably and/or rotatably coupled to the PSU housing 300. For example, the PSU cover 310 may be coupled to the first side panel 324 via a first pin 334, and to the second side panel 326 via a second pin (not shown). The first pin 334 and the second pin allow the rotation of the PSU cover 310 between the first orientation 302 and the second orientation 304. The PSU cover 310 includes a first elongated plate 312 and a second elongated plate 314. The first elongated plate 312 and the second elongated plate 314 are perpendicular to each other.

In this example, the PSU cover 310 is configured to alternate between the first orientation 302 (e.g., an open orientation) and the second orientation 304 (e.g., a closed orientation). In the first orientation 302, the first elongated plate 312 of the PSU cover 310 is above and parallel to the top panel 320 of the PSU housing 300, In the second orientation 304, the second elongated plate 314 of the PSU cover 310 is about flush with and parallel to the top panel 320 of the PSU housing 300. In some implementations, the PSU cover 310 further includes an aperture 316 for receiving a screw to affix the PSU cover 310 in the second orientation 304 by insertion of the screw into a portion of the system chassis 400 (FIG. 4).

Figure 4:
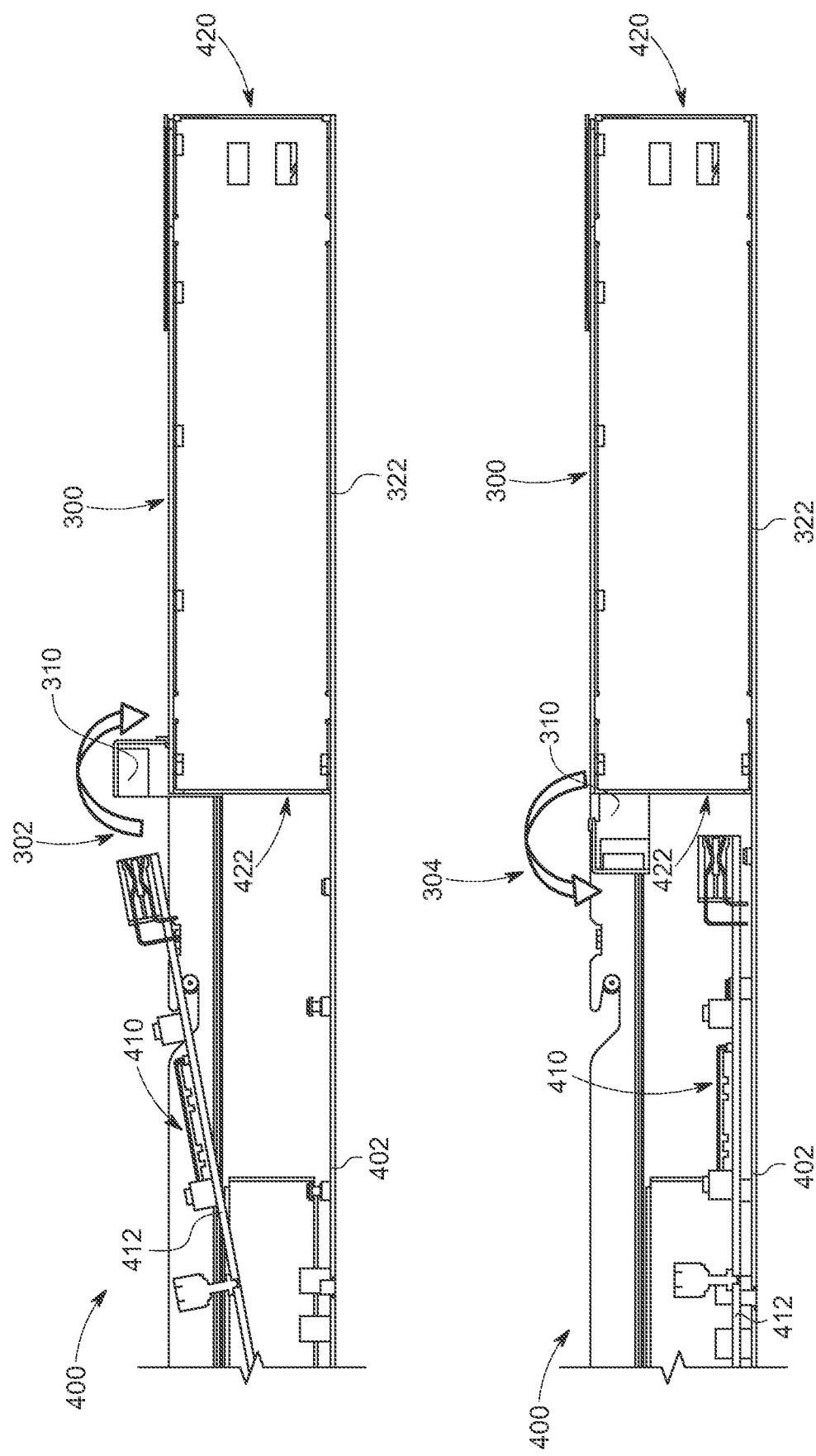
FIG. 4 is a cross-sectional view showing how to place a printed circuit board assembly (PCBA) in the system chassis of FIG. 3, according to certain aspects of the present disclosure.

Referring to FIG. 4, a cross-sectional view of a system chassis 400 is shown, according to certain aspects of the present disclosure. The system chassis 400 includes the PSU housing 300 and the PSU cover 310 of FIG. 3. A printed circuit board assembly (PCBA) 410 having a printed circuit board (PCB) 412 is placed in the system chassis 400.

The system chassis 400 includes a base panel 402 that extends from the bottom panel 322 of the PSU housing 300, in a direction opposite to the first end 420 of the PSU housing 300. In some implementations, the base panel 402 of the system chassis 400 is integrated with the bottom panel 322 of the PSU housing 300. As shown, at least a portion of the base panel 402 supports the PCB 412 of the PCBA 410.

As shown, the PSU cover 310 is coupled to the PSU housing 300 at a second end 422 of the PSU housing 300. In order to lower the PCBA 410 onto the bottom panel 322 of the PSU housing 300, the PSU cover 310 may be positioned in the first orientation 302, thereby allowing unobstructed movement of the PCBA 410. After the PCBA 410 is installed in the system chassis 400, the PSU cover 310 may be positioned in the second orientation 304. The system chassis 400 is then ready to receive a PSU 500 (FIG. 5) from the first end 420 of the PSU housing 300.

Figure 5:
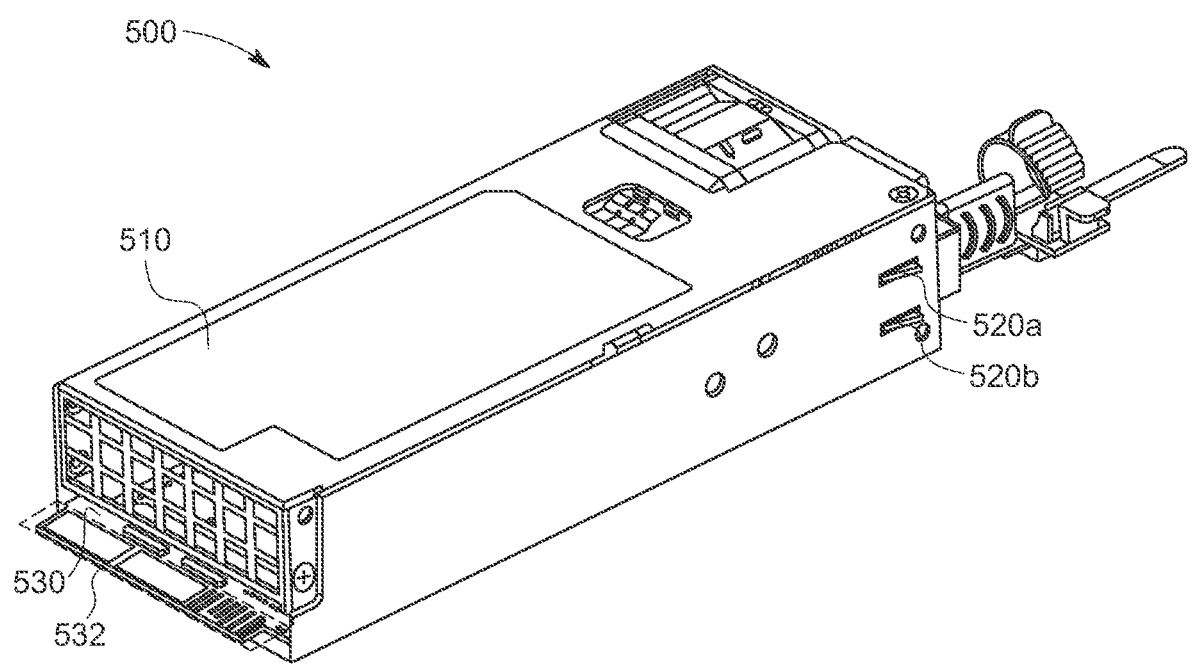
FIG. 5 is a perspective view showing a PSU configured to be installed in the system chassis of FIG. 3, according to certain aspects of the present disclosure.

Referring to FIG. 5, a perspective view of the PSU 500 configured to be installed in the system chassis 400 (FIG. 4) is shown, according to certain aspects of the present disclosure. The PSU 500 includes a body 510, two retractable latches 520a and 520b, and a control board 530. A portion 532 of the control board 530 protrudes from the body 510 of the PSU 500.

Figure 6:
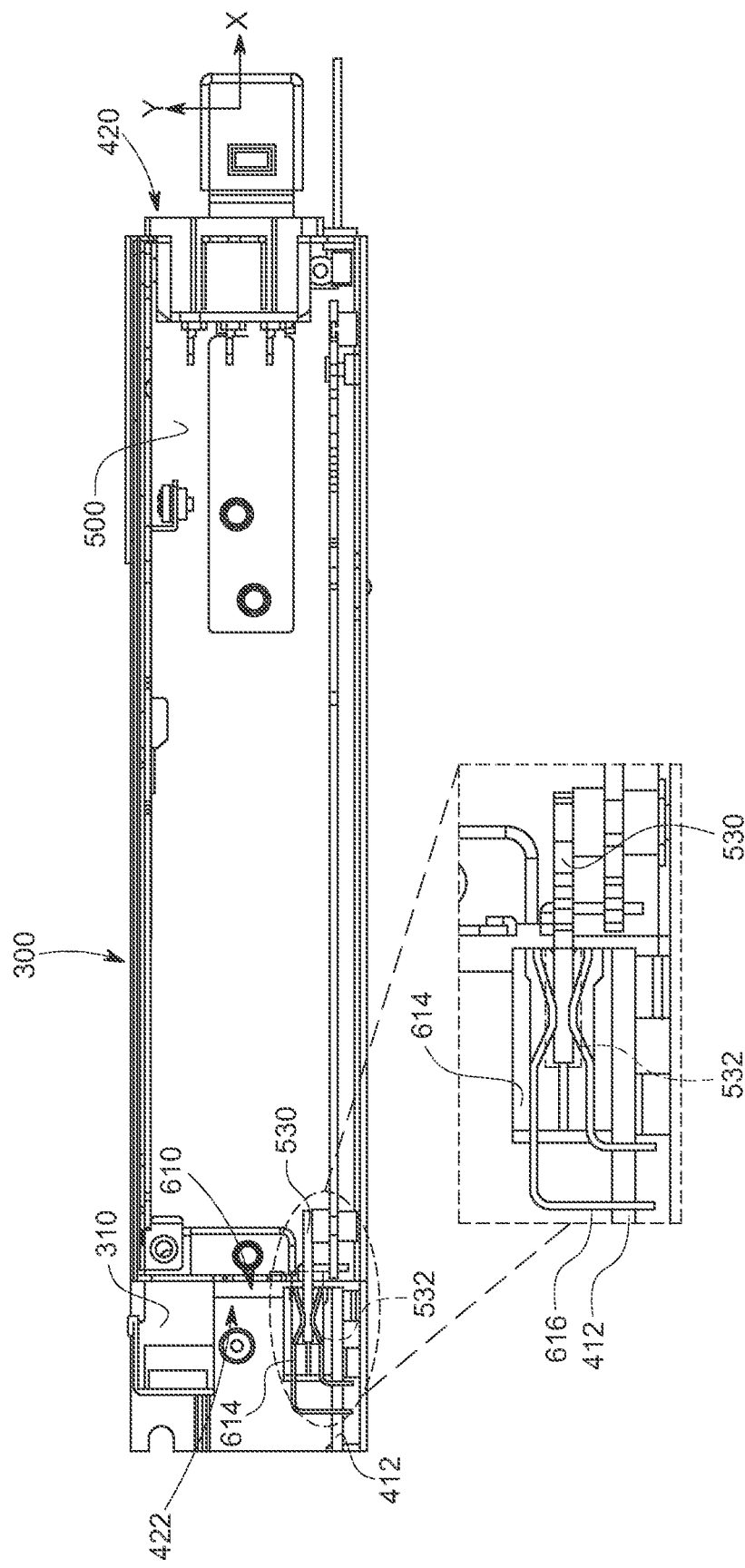
FIG. 6 is a cross-sectional view showing the PSU of FIG. 5 correctly installed in the system chassis of FIG. 3, according to certain aspects of the present disclosure.

Referring to FIG. 6, a cross-sectional view of the PSU 500 correctly installed in the system chassis 400 is shown, according to certain aspects of the present disclosure. The PSU 500 may be inserted from the first end 420 of the PSU housing 300 and pushed towards the second end 422 of the PSU housing 300. When the PSU housing 300 receives the PSU 500 correctly (i.e., right-side up), the control board 530 of the PSU extends through an opening 610 that is uncovered by the PSU cover 310. A connector 614 receives the protruding portion 532 of the control board 530, and couples it to the PCB 412. The connector 614 may further include a clamp 616 or a spring that holds the protruding portion 532 of the control board 530 in place. Additionally, in some implementations, when the PSU housing 300 receives the PSU 500 correctly, the retractable latches 520a and 520b (FIG. 5) of the PSU 500 are retracted, because the PSU 500 is fully inserted into the PSU housing 300.

Figure 7:
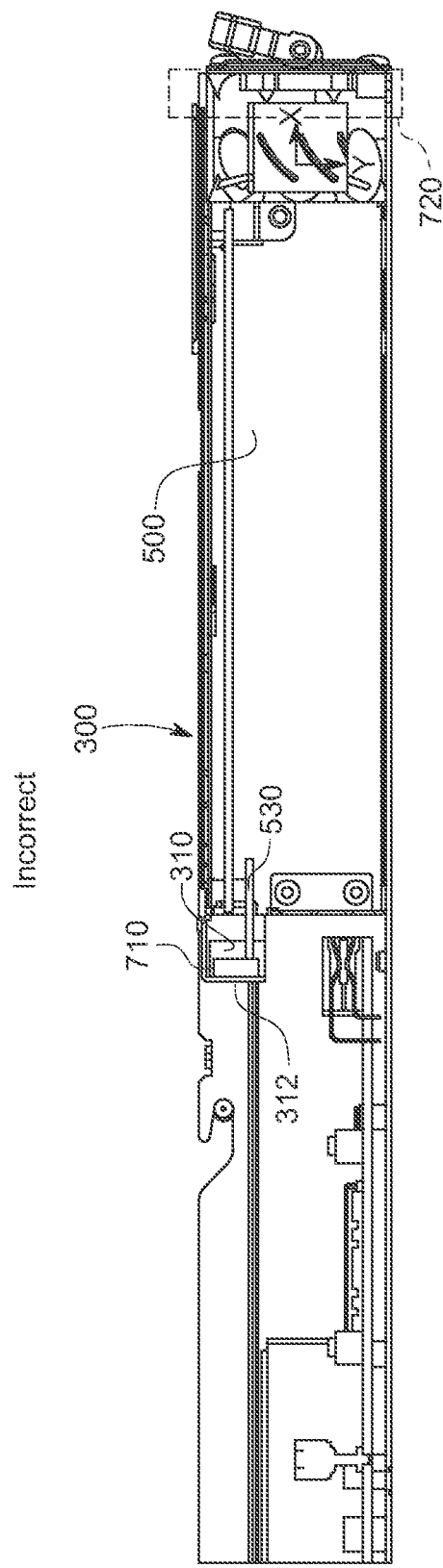
FIG. 7 is a cross-sectional view showing the PSU of FIG. 5 incorrectly installed in the system chassis of FIG. 3, according to certain aspects of the present disclosure.

Referring to FIG. 7, a cross-sectional view of the PSU 500 incorrectly installed in the system chassis 400 is shown, according to certain aspects of the present disclosure. When the PSU housing 300 receives the PSU 500 incorrectly (i.e., upside-down), the first elongated plate 312 of the PSU cover 310 contacts the control board 530 of the PSU 500. In some implementations, the PSU cover 310 includes a stopper 710 coupled to the first elongated plate 312. The first elongated plate 312 then contacts the control board 530 of the PSU 500 via the stopper 710, which may protect the control board 530 from being scratched and/or damaged. Additionally, when the PSU housing 300 receives the PSU 500 upside-down, the first elongated plate 312 of the PSU cover 310 prevents the PSU 500 from being inserted as far as when the PSU housing 300 receives the PSU 500 right-side up as in FIG. 6. Thus, a portion 720 of the PSU 500 remains outside of the PSU housing 300, which allows a user to quickly determine that the PSU 500 is incorrectly installed.

Figure 8:
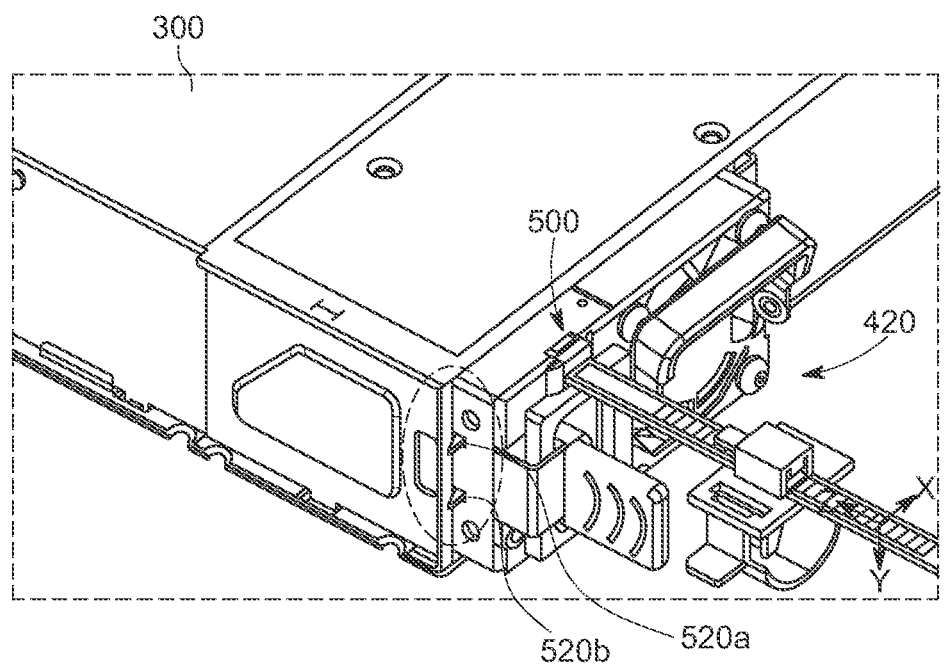
FIG. 8 is a perspective view showing the PSU of FIG. 5 incorrectly installed in the system chassis of FIG. 3, according to certain aspects of the present disclosure.

Referring to FIG. 8, another perspective view of the PSU 500 incorrectly installed in the system chassis 400 is shown, according to certain aspects of the present disclosure. When the PSU housing 300 receives the PSU 500 upside-down, the retractable latches 520a and 520b of the PSU 500 are exposed outside the PSU housing 300, because the PSU 500 cannot be fully inserted into the PSU housing 300. Thus, the user can determine that the PSU 500 is incorrectly installed if the retractable latches 520a and 520b of the PSU 500 are exposed. In some implementations, the user can then remove the PSU 500 from the PSU housing 300, rotate the PSU about 180 degrees around a longitudinal axis z of the PSU, and re-insert the PSU 500 from the first end 420 of the PSU housing 300.

The example PSU cover 310 may be built into any chassis for any electronic system having a PSU. Such electronic systems may include, for example, any type of server, storage devices, network switches, communications equipment, and the like.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A power supply unit (PSU) housing configured to receive a PSU from a first end of the PSU housing, the PSU housing comprising:
   a top panel;
   a bottom panel opposite to the top panel;
   a first side panel;
   a second side panel opposite to the first side panel, the first side panel and the second side panel defining a width of the PSU housing; and
   a PSU cover extending along the width of the PSU housing, the PSU cover including a first elongated plate and a second elongated plate perpendicular to each other, the PSU cover configured to rotate relative to the top panel, such that (i) in a first orientation, the first elongated plate of the PSU cover is above and parallel to the top panel, and (ii) in a second orientation, the second elongated plate of the PSU cover is about flush with and parallel to the top panel;
   wherein the PSU includes a body, a retractable latch, and a control board, and wherein a portion of the control board protrudes from the body of the PSU; and
   wherein when the PSU housing receives the PSU in a correct orientation, the control board of the PSU extends through an opening at the second end of the PSU housing uncovered by the PSU cover, such that the retractable latch of the PSU is retracted.

2. The PSU housing of claim 1, wherein when the PSU housing receives the PSU in an incorrect orientation, the first elongated plate of the PSU cover contacts the control board of the PSU, and the retractable latch of the PSU is exposed outside the PSU housing.

3. The PSU housing of claim 1, wherein the PSU cover includes an aperture for receiving a screw to affix the PSU cover in the second orientation.

4. The PSU housing of claim 1, wherein the PSU housing is positioned within a system chassis configured to receive one or more electronic components outside of the PSU housing.

5. The PSU housing of claim 4, wherein the system chassis includes a base panel extending from the bottom panel of the PSU housing in a direction opposite to the first end of the PSU housing, such that at least a portion of the base panel is configured to support a printed circuit board (PCB).

6. The PSU housing of claim 1, wherein the PSU cover is rotatably coupled to the first side panel and the second side panel of the PSU housing.

7. A system comprising:
   a power supply unit (PSU) housing configured to receive a PSU from a first end of the PSU housing, the PSU housing including a top panel, a bottom panel opposite to the top panel, a first side panel, and a second side panel opposite to the first side panel, the first side panel and the second side panel defining a width of the PSU housing;
   a PSU cover extending along the width of the PSU housing, the PSU cover including a first elongated plate and a second elongated plate perpendicular to each other, the PSU cover coupled to the PSU housing at a second end of the PSU housing such that (i) the first elongated plate of the PSU cover is positioned at a distance from the second end of the PSU housing, and (ii) the second elongated plate of the PSU cover is about flush with and parallel to the top panel of the PSU housing; and
   a printed circuit board (PCB) outside the PSU housing, the PCB supported on a base panel extending from the bottom panel of the PSU housing;
   wherein the PSU includes a body, a retractable latch, and a control board, and wherein a portion of the control board protrudes from the body of the PSU; and
   wherein when the PSU housing receives the PSU in a correct orientation, the portion of the control board of the PSU extends through an opening uncovered by the PSU cover, such that the retractable latch of the PSU is retracted.

8. The system of claim 7, wherein when the PSU housing receives the PSU in the correct orientation, the portion of the control board of the PSU extends into a connector of the PCB.

9. The system of claim 7, wherein when the PSU housing receives the PSU in an incorrect orientation, the first elongated plate of the PSU cover contacts the control board of the PSU, such that the retractable latch of the PSU is exposed outside the PSU housing.

10. The system of claim 7, wherein the PSU housing includes a divider positioned between the first side panel and the second side panel, the divider of the PSU housing configured to separate a first PSU from a second PSU.

11. The system of claim 7, further comprising a system housing such that the PSU housing is positioned within the system housing, the system housing configured to receive one or more electronic components outside of the PSU housing.

* * * * *